(12) United States Patent
Neujahr

(10) Patent No.: US 10,928,454 B2
(45) Date of Patent: Feb. 23, 2021

(54) DEVICE FOR DIAGNOSING A MECHANICAL SYSTEM WHICH IS DRIVEN BY MEANS OF AN ELECTRIC DRIVE MOTOR

(71) Applicant: DEUTSCHE BAHN AG, Berlin (DE)

(72) Inventor: Gerd Neujahr, Rimbach (DE)

(73) Assignee: DEUTSCHE BAHN AG, Berlin (DE)

( * ) Notice: Subject to any disclaimer, the term of this patent is extended or adjusted under 35 U.S.C. 154(b) by 66 days.

(21) Appl. No.: 16/315,920

(22) PCT Filed: Jul. 14, 2017

(86) PCT No.: PCT/EP2017/067890
§ 371 (c)(1),
(2) Date: Jan. 7, 2019

(87) PCT Pub. No.: WO2018/019619
PCT Pub. Date: Feb. 1, 2018

(65) Prior Publication Data
US 2019/0146037 A1    May 16, 2019

(30) Foreign Application Priority Data
Jul. 27, 2016   (DE) ...................... 10 2016 213 766.2

(51) Int. Cl.
*G01R 31/34* (2020.01)
*G01R 15/16* (2006.01)
(Continued)

(52) U.S. Cl.
CPC ........... *G01R 31/343* (2013.01); *G01R 15/16* (2013.01); *G01R 21/06* (2013.01); *H02P 6/16* (2013.01);
(Continued)

(58) Field of Classification Search
CPC .... G01R 31/34; G01R 31/343; G01R 31/346; G01R 21/06; G01R 21/133; G01R 15/16;
(Continued)

(56) References Cited

U.S. PATENT DOCUMENTS

| 3,621,392 A | 11/1971 | Liebermann et al. |
| 5,514,978 A | 5/1996 | Koegl et al. |

(Continued)

FOREIGN PATENT DOCUMENTS

| DE | 41 40 556 A1 | 6/1993 |
| DE | 10 2010 043 254 A1 | 5/2013 |

(Continued)

OTHER PUBLICATIONS

International Search Report (PCT/ISA/210) issued in PCT/EP2017/067890, dated Sep. 19, 2017.

*Primary Examiner* — Minh N Tang
(74) *Attorney, Agent, or Firm* — Birch, Stewart, Kolasch & Birch, LLP

(57) ABSTRACT

In a device for diagnosing a mechanical system driven by an electric drive motor, the drive motor thereof, and the shifting device thereof include at least one sensor for detecting the current curve in a conductor of the electric connection of the drive motor. The precision and the degree of detail of the diagnosis are to be improved compared to the prior art and expanded to include the drive motor and the shifting device in order to improve the efficiency and aim of the maintenance process carried out in response to the diagnosis. This is achieved in that the device additionally has sensors for detecting the voltage curves in the conductors of the electric connection of the drive motor, wherein each conductor is paired with a sensor for detecting the current curve and with a sensor in interaction with a sensor in order to detect the voltage curve.

3 Claims, 1 Drawing Sheet

(51) Int. Cl.
*G01R 21/06* (2006.01)
*H02P 21/20* (2016.01)
*H02P 6/16* (2016.01)
*H02P 29/024* (2016.01)

(52) U.S. Cl.
CPC ............ *H02P 21/20* (2016.02); *H02P 29/024* (2013.01); *H02P 29/0241* (2016.02); *H02P 2203/00* (2013.01)

(58) Field of Classification Search
CPC ......... G01R 15/207; H02P 6/16; H02P 21/20; H02P 29/024; H02P 29/0241
See application file for complete search history.

(56) References Cited

U.S. PATENT DOCUMENTS

| | | | | |
|---|---|---|---|---|
| 5,786,708 | A * | 7/1998 | Premerlani | G01R 31/343 324/545 |
| 6,611,771 | B1 * | 8/2003 | Habetler | H02H 1/0092 702/58 |
| 7,081,760 | B2 * | 7/2006 | Mirafzal | G01R 31/343 324/545 |
| 9,234,922 | B2 * | 1/2016 | Behringer | G01R 11/02 |
| 2007/0282548 | A1 * | 12/2007 | Ling | H02H 1/0092 702/65 |
| 2013/0229192 | A1 | 9/2013 | Behringer et al. | |

FOREIGN PATENT DOCUMENTS

| | | |
|---|---|---|
| EP | 2 544 364 B1 | 8/2014 |
| JP | 2005-354881 A | 12/2005 |
| WO | WO 01/85523 A1 | 11/2001 |

* cited by examiner

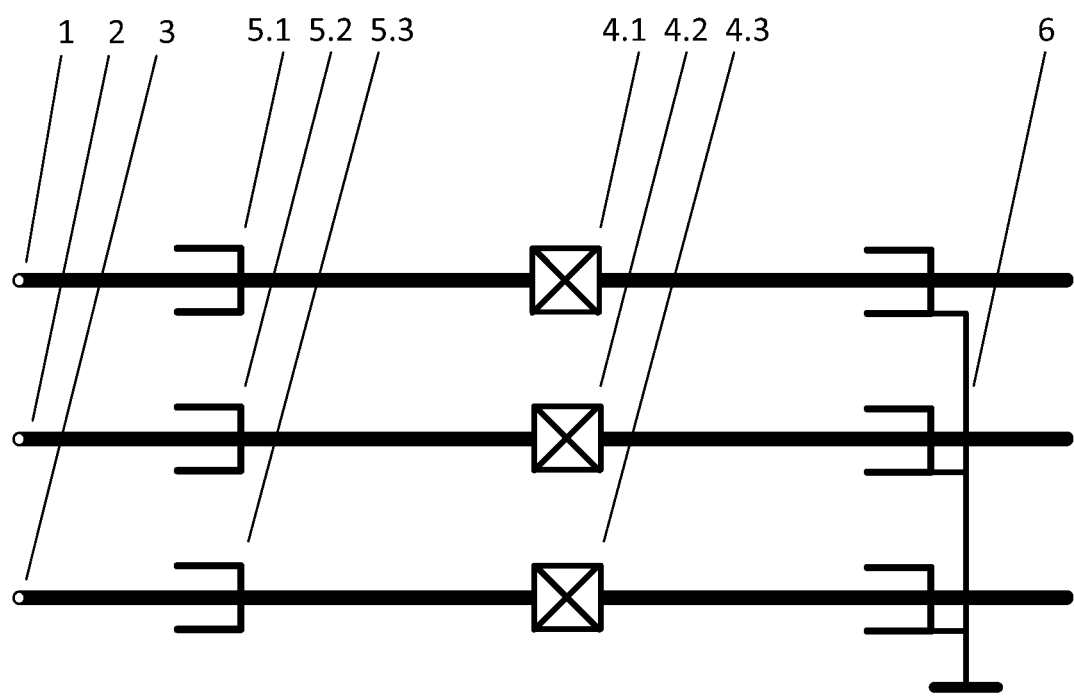

DEVICE FOR DIAGNOSING A MECHANICAL SYSTEM WHICH IS DRIVEN BY MEANS OF AN ELECTRIC DRIVE MOTOR

BACKGROUND OF THE INVENTION

Field of the Invention

The invention relates to a device for diagnosing a mechanical system which is driven by means of an electric drive motor, comprising at least one sensor for detecting the current curve in a conductor of the electric connection of the drive motor. In this case, the electric drive can be fed with DC current, AC current or three-phase AC current.

Description of Related Art

Such diagnostic devices are known from the prior art. The aim of these devices is to monitor the correct functionality of the mechanical system and, in this case, in particular, to detect sluggishness within the mechanical systems driven by the motors. Thus, sluggishness within a mechanical system, caused e.g. by wear and tear or inadequate adjustment, would become noticeable as a result of the power consumption of the drive motor changing in comparison to a target state (i.e. generally increased). Thus, the current curve during a complete drive cycle—that is to say from starting up to the subsequent standstill of the drive motor—is used as a criterion for the mechanical state of the mechanical system. If, in comparison to the reference values of a correct state, the power consumption of the drive motor is higher, or if it deteriorates between two drive cycles following one another at a time interval (i.e. shifts to higher values), it is assumed that there is a direct correlation between the higher power consumption and the movement of the mechanical system driven by the motor. Increasing power consumption thus provides an indication of the sluggishness of the mechanical system and of its increasing need for servicing and/or maintenance. Diagnostic devices of this type are used, in particular, in drive systems, which are characterised by a plurality of repeating sequence cycles, such as e.g. in the case of a reverse operation between two states. Switch actuators are a typical example of this.

DE 37 15 478 A1 describes a circuit arrangement for monitoring a switch drive, which is supplied by means of a four-wire-circuit via a three-phase supply. Circuit breakers and current monitors are arranged in the respective conductors of the four-wire-circuit. With a motor-driven rotation of the switch from a first to a second position, the current flow in the current monitors is measured and a bit pattern is determined therefrom, on the basis of which it should be possible to draw conclusions regarding the state of the switch. However, with a device of this type, it is only possible to monitor reaching the end positions of the motor-driven actuating system. Possible sluggishness of the drive system is not detected as long as this does not prevent the end position being reached.

A device, which determines the energy requirement of a three-phase switch drive motor, is known from WO 2008/089502 A2, from which the state of the switch can be deduced in turn. The energy requirement is determined by approximate measurement of the active current component in a conductor of the drive motor by means of a choke connected in parallel to the conductor, wherein the conductor connected to the choke is routed in the opposite direction to the particular conductor via a single-axis Hall effect sensor.

Finally, a generic diagnostic device is known from DE 10 2014 223 234 B3, which determines the magnetic field of a conductor by means of a multidimensional Hall effect sensor surrounding the conductor and, in this way, measures the current curve in the particular conductor of the switch drive. In this case, the respective current curve in each of these conductors is measured on at least two different conductors. The direction of rotation of the switch drive motor can be determined by comparing measured values determined on two different conductors. In addition, by comparing current measured values obtained on a conductor with previous measured values for the same conductor, a conclusion can be drawn regarding changes in the sluggishness of the switch. Multidimensional magnetic field sensors of this type are also able to measure parts of the magnetic field (generated by the current flowing in the conductor of the drive motor), which are not perpendicular to the sensor. Furthermore, sensors of this type can be applied directly to the particular conductor in the form of a measuring strip and can thus be retrofitted in a very space-saving manner without interfering with existing cabling.

However, with these previously known devices, only sluggishness that changes over time can be detected, without a more precisely specified diagnosis of the possible cause of this sluggishness being possible. In particular, because measurements of this type record current curves over the time axis, segmentation of the current curve relative to the mechanical path is difficult and does not allow a detailed diagnosis of the exact location of the sluggishness in the mechanical process. Thus, it is necessary, during the course of ongoing maintenance, to analyse the entire mechanical system in situ and to carry out fault finding.

SUMMARY OF THE INVENTION

The aim of the present invention is thus to provide a device for diagnosing a mechanical system driven by means of an electric drive motor, comprising at least one sensor for detecting the current curve in a conductor of the electrical connection of the drive motor, which improves the accuracy and degree of detail of the diagnosis and thereby also increases the efficiency and targeting of maintenance in response to the diagnosis.

According to the invention, this aim is achieved in that the device also has sensors for detecting the voltage curves in the conductors of the electrical connection of the drive motor, wherein a sensor is assigned to each conductor to detect the current curve and a sensor is assigned to each conductor to detect the voltage curve.

By means of such voltage sensors, the electrical fields can be detected bidirectionally and individually in each conductor of the drive motor. In addition to the amplitudes, the zero crossings of the voltage curves can also be specifically detected in each conductor. Such metrologically unambiguous detection of the zero crossings of the voltage sine waves in the conductors of the drive motor allows the activation and deactivation times for measurement to be precisely determined and, thereby, also forms the basis for correct segmentation of the active current curve of a switching process. In addition, in the voltage curves, switching operations such as e.g. star-delta switching or switching operations within the 4-wire-circuit, in the case of switch drives, are visible and can be used as further fixed points in segmentation of the active current curve of a switching process. In the known prior art, in the field of the diagnosis of mechanical processes, such segmentation was not possible. In previously known diagnostic systems, association between the measured current curves in the conductors and the actual functional stages of the driven mechanical system was generally undertaken with reference to a deterministic scheme based on empirical knowledge. Diagnostic systems of this type are thus based on a more or less empirically obtained assumption that the various functional stages or states of a mechanical system during the chronological course of a drive cycle have, in each case, a fixed defined time interval for starting the drive motor for use (i.e. always started after the end of the same time interval after starting the drive motor). However, a diagnosis of this type based on hypothetical assumptions can only deliver imprecise and comparatively non-specific results, since there is no alignment with the actual sequence of actions taking place within the system. It stands to reason that, even in the case of increasing sluggishness of the mechanical system, the actual sequence of actions must almost inevitably deviate from the original timings determined in a "non-sluggish" condition. In previously known measuring methods, no account is taken of the fact that asynchronous three-phase motors have a lower rotational speed at higher loads, as a result of which the actual mechanical sequences of actions slows down.

A further complication is that, in the case of the measurement of the current curves in the conductors known from the prior art using Hall effect sensors, no precise activation and deactivation times can be determined. In the known prior art, the measured current must first be applied to the data logger for a certain time in order to start measurement. However, a start of a measurement generated in this way is not identical to actually activating the drive.

However, other approaches, which aim to use mathematical filters on the active current flow have proved unsuitable.

In AC and three-phase AC motors, the invention also facilitates precise determination of the phase shift angle φ between current and voltage. This precise, contactless measurement of the phase shift ensures precise recording of a cos φ curve and calculation of the precise active current component, which corresponds to the mechanical sluggishness of the driven system. The improvements achieved in this way in the accuracy and the degree of detail in determining the active current, lead to an improvement in the diagnosis based thereon. As a result, defects in mechanical systems can be more reliably prevented using the data obtained by means of the device according to the invention. A more accurate diagnosis results in more efficient and targeted deployment of maintenance personnel responding to the diagnosis. In addition, the invention provides the exact proportions of active current, reactive current and apparent current as well as the associated power factor curves. Long-term observation of these values ensures a reliable motor diagnosis. For motors, whose values are symmetrical and behave in a stationary manner, there is no danger of an unexpected failure.

In the prior art, permanent operation of the sensors and the data logger is necessary. The mechanical systems to be diagnosed, with repetitive processes such as, e.g. gates or switches, are generally not permanently in operation. Metrologically unambiguous detection of the zero crossings of the voltage sine waves in the conductors of the drive motor according to the invention also facilitates automatic control of the device. To this end, the voltage sensor signals are transmitted to an evaluation unit. As soon as the latter detects a sinusoidal electrical field, the device is activated. In this way, an energy-saving standby mode can be established for the diagnostic device.

In addition, however, external triggering of measurements is possible, which can be useful e.g. in the case of permanently running drive motors. To this end, the mechanical system driven by the drive motor is equipped with a trigger point, via the sensor system of which a start signal is generated for starting measurement and—after e.g. a complete cycle of the motor-driven mechanical system—a stop signal is generated for ending measurement. A diagnostic device according to the invention, in connection with permanently running drive motors is useful e.g. for escalators, conveyors or the like, operating in continuous unidirectional mode.

An appropriate further development of the invention also consists of the sensors for detecting the voltage curves in the conductors being designed as sensors for detecting the electrical field in the particular conductor. In this case, the precise chronological sine wave of the voltages is measured. A sensor of this type can be designed very simply, e.g. in the form of an electrically conductive small plate or wire on which the electrical load moves through the electrical field. This load displacement, described as induction, is detected metrologically and evaluated. Measuring devices, which deploy this method, are used to measure electrical interference fields in rooms and also to detect live wires in walls. They only provide general evidence of the presence of an electrical field and its field strength. They are also used in galvanically isolated voltage testers, which detect the presence of voltage through the insulated conductor.

The invention also stipulates that the device also has a sensor for detecting the cumulative electrical field of all three conductors of an electrical connection of a three-phase drive motor. A sensor of this type adds the electrical fields of all three conductors of the drive motor together to produce a total value. In this way, a specific reference point is created for measuring and evaluating the electrical fields of the conductors within the diagnostic device. This measuring method is particularly suitable for measuring three-phase AC voltage, since the sum of the three sine values is zero. The reference point can also be determined mathematically. This method can be used advantageously for measuring AC voltage and DC voltage. In both methods there is no need for the complex feedback-free introduction of an external reference potential, e.g. via the power supply of the diagnostic device, which is fault-prone as a result of the conduction paths. The measurement set-up of the device according to the invention provides the precise sine wave with the points-in-time of û (U-ceiling value=peak value) and the zero-crossings of the measured voltages.

Therefore, in a diagnostic device according to the invention, the supply voltage may originate from an independent, potential-free source, e.g. a battery, a solar cell or a laboratory power supply, which is galvanically isolated by means of an isolating transformer, all of which could be considered a voltage source. The freedom from any reference potential achieved in this way also opens up the possibility for using wireless and fibre-optic interfaces.

The invention also covers the diagnosis of drive systems for rail switches or conveyor systems, each comprising at least one electrically operated drive motor and a device designed according to the aforementioned characteristics for diagnosis.

BRIEF DESCRIPTION OF THE DRAWINGS

The present invention is described in more detail below with reference to an exemplary embodiment and the corresponding drawing.

The FIGURE is a schematic representation of the measurement set-up of a diagnostic device according to the invention, wherein the drive motor and the mechanical system driven by the former are not shown in The FIGURE for the sake of clarity.

DETAILED DESCRIPTION OF THE PREFERRED EMBODIMENTS

Their specific design corresponds to the normal prior art and is also of no further relevance for understanding the invention. The device is designed to receive a maximum of three motor connection lines, the conductors (1, 2, 3). A Hall effect sensor (4.1, 4.2, 4.3) for metrologically detecting the current curve in the particular conductor is mounted on each individual conductor (1, 2, 3). Furthermore, a sensor (5.1, 5.2, 5.3) for determining the conductor's electrical field is mounted on each individual conductor (1, 2, 3); this sensor metrologically detects the voltage curve in the particular conductor. Furthermore, there is also an additional sensor (6) for detecting the electrical field. This sensor determines the cumulative electrical field of the conductors (1, 2, 3) and generates the reference potential for voltage measurement. The individual sensors (5.1, 5.2, 5.3) are measured against the cumulative sensor (6). All the sensors, including the Hall effect sensors (4.1, 4.2, 4.3) are configured for bipolar detection of the respective magnetic or electrical fields, i.e. for measuring the sine wave of the respective field strengths, including their zero crossings. The individual sensors (5.1, 5.2, 5.3) measure the electrical fields of each conductor (1, 2, 3), which run synchronously with the voltage sine wave in the particular conductor. The Hall effect sensors (4.1, 4.2, 4.3) measure the magnetic fields of each conductor (1, 2, 3), which run synchronously with the current sine wave in the particular conductor. Any transit time differences, which are caused by the different measuring principles, are compensated mathematically during the course of signal evaluation. The zero crossings of the voltage curves and current curves in each conductor are determined as a result of these measurements. The phase angles φ, which are recorded over the entire measuring procedure, can be determined from the time differences of these zero crossings. The cos φ curve recorded in this way reacts very sensitively to changes in the mechanical load and can improve diagnosis, together with the active current curve. Furthermore, switching processes are shown in the cos φ curve, as they are used in star-delta switching or the 4-wire switch circuit for control and monitoring. These switching processes can be used as fixed points for segmenting the mechanical sequence.

The electrical field measured with the voltage sensors reacts very sensitively to disturbances in the voltage supply. Contact bounces or brief voltage supply interruptions resulting from defective switching devices are reliably detected.

Therefore, the device provides data, which can be used in connection with a diagnostic system for monitoring and diagnosing the switching device, the electrical drive and the mechanical system.

REFERENCE NUMBER LIST

1 Conductor 1
2 Conductor 2
3 Conductor 3
4.1/4.2/4.3 Hall effect sensors
5.1/5.2/5.3 Sensors for detecting the electrical field of a single conductor (1, 2, 3)
6 Sensor for detecting the cumulative electrical field of the conductors (1, 2, 3)

The invention claimed is:

1. A device for diagnosing a mechanical system driven by an electric drive motor, comprising:
   a first plurality of sensors for respectively detecting a current curve in each of a plurality of conductors of an electric connection of the electric drive motor;
   a second plurality of sensors for respectively detecting a voltage curve in each of the plurality of conductors of the electrical connection of the electric drive motor; and
   a third sensor, different from the first and second plurality of sensors, for detecting a cumulative electrical field of all of the plurality of conductors of the electrical connection of the electric drive motor, and generating a reference potential for voltage measurements performed by the second plurality of sensors,
   wherein the first plurality of first sensors for detecting the current curve are assigned to each of the plurality of conductors, and the second plurality of second sensors for detecting the voltage curve are assigned to each of the plurality of conductors, and
   wherein each of the second plurality of second sensors for detecting the voltage curve is designed as a contactless sensor for detecting an electrical field around the plurality of conductors.

2. A drive system for a rail switch, comprising:
   at least one electric drive motor that is electrically powered for driving the rail switch; and
   the device for diagnosis according to claim 1, said device being coupled to the at least one electric drive motor.

3. A drive system for a conveyor system, comprising:
   at least one electric drive motor that is electrically powered for driving the conveyor system; and
   the device for diagnosis according to claim 1, said device being coupled to the at least one electric drive motor.

* * * * *